(12) United States Patent
Jacksier et al.

(10) Patent No.: US 7,850,790 B2
(45) Date of Patent: *Dec. 14, 2010

(54) REACTIVE GASES WITH CONCENTRATIONS OF INCREASED STABILITY AND PROCESSES FOR MANUFACTURING SAME

(75) Inventors: Tracey Jacksier, Lisle, IL (US); Robert Benesch, Chicago, IL (US); Malik Haouchine, Chicago, IL (US)

(73) Assignee: American Air Liquide, Inc., Fremont, CA (US)

( * ) Notice: Subject to any disclaimer, the term of this patent is extended or adjusted under 35 U.S.C. 154(b) by 65 days.

This patent is subject to a terminal disclaimer.

(21) Appl. No.: 12/416,556

(22) Filed: Apr. 1, 2009

(65) Prior Publication Data

US 2009/0223594 A1 Sep. 10, 2009

Related U.S. Application Data

(60) Division of application No. 11/114,953, filed on Apr. 25, 2005, which is a continuation-in-part of application No. 10/157,466, filed on May 29, 2002, now abandoned.

(60) Provisional application No. 60/306,014, filed on Jul. 17, 2001, provisional application No. 60/306,012, filed on Jul. 17, 2001, provisional application No. 60/541,795, filed on Apr. 23, 2004.

(51) Int. Cl.
*C23C 16/00* (2006.01)
*B65D 85/00* (2006.01)

(52) U.S. Cl. ............... 148/279; 148/240; 148/277; 148/284; 427/248.1; 427/255.11; 427/255.18; 427/255.23; 206/0.6; 252/372

(58) Field of Classification Search ............ 148/240, 148/276, 277, 279, 284; 427/248.1, 255.11, 427/255.18, 255.23; 206/0.6; 252/372
See application file for complete search history.

(56) References Cited

U.S. PATENT DOCUMENTS 224,426 A 2/1880 Hartmann (Continued)

FOREIGN PATENT DOCUMENTS

CA 614495 2/1961

(Continued)

OTHER PUBLICATIONS

Welty et al., "Fundamentals Of Momentum, Heat and Mass Transfer: 3rd Ed." John Wiley & Sons, Inc. 1984, p. 471-482.

(Continued)

*Primary Examiner*—Roy King
*Assistant Examiner*—Lois Zheng
(74) *Attorney, Agent, or Firm*—Donna Blalock Holguin

(57) ABSTRACT

Methods of passivating a metal surface are described, the methods comprising the steps of exposing the metal surface to a silicon-containing passivation material, evacuating the metal surface, exposing the treated surface to a gas composition, having a concentration of reactive gas that is greater than an intended reactive gas concentration of gas to be transported by the metal surface, evacuating the metal surface to remove substantially all of the gas composition to enable maintenance of an increased shelf-life, low concentration reactive gas at an intended concentration, and exposing the metal surface to the reactive gas at the intended reactive gas concentration. Manufactured products, high stability fluids, and methods of making same are also described.

10 Claims, 3 Drawing Sheets

U.S. PATENT DOCUMENTS

| | | |
|---|---|---|
| 722,981 A | 3/1903 | Herreshoff |
| 2,451,915 A | 10/1948 | Buresh |
| 2,700,188 A | 1/1955 | Buresh et al. |
| 2,703,441 A | 3/1955 | Langdon et al. |
| 2,744,294 A | 5/1956 | Buresh et al. |
| 2,882,243 A | 4/1959 | Milton |
| 2,882,244 A | 4/1959 | Milton |
| 2,950,962 A | 8/1960 | Carlson et al. |
| 2,958,593 A | 11/1960 | Hoover et al. |
| 2,972,527 A | 2/1961 | Upton, Jr. |
| 2,991,151 A | 7/1961 | Breck et al. |
| 2,995,423 A | 8/1961 | Breck et al. |
| 2,996,358 A | 8/1961 | Milton |
| 3,001,869 A | 9/1961 | Longstreth et al. |
| 3,008,803 A | 11/1961 | Milton |
| 3,010,789 A | 11/1961 | Milton |
| 3,012,853 A | 12/1961 | Milton |
| 3,044,482 A | 7/1962 | Golden |
| 3,054,657 A | 9/1962 | Breck et al. |
| 3,130,007 A | 4/1964 | Breck |
| 3,140,249 A | 7/1964 | Plank et al. |
| 3,140,252 A | 7/1964 | Frilette et al. |
| 3,140,253 A | 7/1964 | Plank et al. |
| 3,260,582 A | 7/1966 | Zimmer, Jr. et al. |
| 3,638,464 A | 2/1972 | Winter et al. |
| 3,688,453 A | 9/1972 | Legacy et al. |
| 3,780,163 A | 12/1973 | Callighan et al. |
| 3,834,200 A | 9/1974 | Winter |
| 3,847,551 A | 11/1974 | Hutson |
| 3,850,589 A | 11/1974 | Charvat |
| 3,982,359 A | 9/1976 | Elbel et al. |
| 4,049,396 A | 9/1977 | Hiles |
| 4,057,510 A | 11/1977 | Crouch et al. |
| 4,082,834 A | 4/1978 | Grossman et al. |
| 4,135,130 A | 1/1979 | Wootton |
| 4,137,151 A | 1/1979 | Csicsery |
| 4,159,917 A | 7/1979 | Gluck |
| 4,221,572 A | 9/1980 | Torimae et al. |
| 4,227,350 A | 10/1980 | Fitzer |
| 4,270,937 A | 6/1981 | Adler et al. |
| 4,351,743 A | 9/1982 | Hashimoto |
| 4,358,627 A | 11/1982 | Ameen et al. |
| 4,385,086 A | 5/1983 | Nakayama et al. |
| 4,414,128 A | 11/1983 | Goffinet |
| 4,459,779 A | 7/1984 | Shen |
| 4,485,519 A | 12/1984 | Collier |
| 4,613,345 A | 9/1986 | Thicke et al. |
| 4,622,253 A | 11/1986 | Levy |
| 4,669,163 A | 6/1987 | Lux et al. |
| 4,713,224 A | 12/1987 | Tamhankar et al. |
| 4,724,819 A | 2/1988 | Fleri |
| 4,781,907 A | 11/1988 | McNeill |
| 4,853,148 A | 8/1989 | Tom et al. |
| 4,902,561 A | 2/1990 | McCullough, Jr. et al. |
| 4,923,828 A | 5/1990 | Gluck et al. |
| 4,925,646 A | 5/1990 | Tom et al. |
| 4,927,432 A | 5/1990 | Budinger et al. |
| 4,931,358 A | 6/1990 | Wahl et al. |
| 4,933,373 A | 6/1990 | Moren |
| 4,935,295 A | 6/1990 | Serafini |
| 4,991,362 A | 2/1991 | Heyer et al. |
| 5,011,512 A | 4/1991 | Wald et al. |
| 5,025,596 A | 6/1991 | Heyer et al. |
| 5,045,355 A | 9/1991 | Spiro et al. |
| 5,062,900 A | 11/1991 | Berneron et al. |
| 5,080,822 A | 1/1992 | VanEenam |
| 5,080,831 A | 1/1992 | VanEenam |
| 5,120,512 A | 6/1992 | Masuda |
| 5,176,782 A | 1/1993 | Ishibashi et al. |
| 5,197,852 A | 3/1993 | Walker et al. |
| 5,203,189 A | 4/1993 | Lovejoy et al. |
| 5,232,467 A | 8/1993 | Child et al. |
| 5,250,085 A | 10/1993 | Mevisson |
| 5,255,445 A | 10/1993 | Li et al. |
| 5,273,558 A | 12/1993 | Nelson et al. |
| 5,296,821 A | 3/1994 | Petersen et al. |
| 5,363,604 A | 11/1994 | Heyer |
| 5,385,689 A | 1/1995 | Tom et al. |
| 5,479,727 A | 1/1996 | Fine et al. |
| 5,480,677 A | 1/1996 | Li et al. |
| 5,489,327 A | 2/1996 | Otsuka et al. |
| 5,503,778 A | 4/1996 | Liu et al. |
| 5,573,710 A | 11/1996 | McDonell |
| 5,676,762 A | 10/1997 | Kimura et al. |
| 5,880,850 A | 3/1999 | McAndrew et al. |
| 5,910,292 A | 6/1999 | Alvarez, Jr. et al. |
| 5,963,336 A | 10/1999 | McAndrew et al. |
| 6,054,379 A | 4/2000 | Yau et al. |
| 6,110,258 A | 8/2000 | Fraenkel et al. |
| 6,154,284 A | 11/2000 | McAndrew et al. |
| 6,183,539 B1 | 2/2001 | Rode et al. |
| 6,255,222 B1 | 7/2001 | Xia et al. |
| 6,318,640 B1 | 11/2001 | Coffee |
| 6,325,304 B1 | 12/2001 | Brite et al. |
| 6,328,223 B1 | 12/2001 | Holt et al. |
| 6,328,543 B1 | 12/2001 | Benecke |
| 6,332,562 B1 | 12/2001 | Sweeton |
| 6,334,578 B1 | 1/2002 | House |
| 6,345,404 B1 | 2/2002 | Stephens et al. |
| 6,345,773 B1 | 2/2002 | Shanklin et al. |
| 6,346,201 B1 | 2/2002 | Felkner |
| 6,348,227 B1 | 2/2002 | Caracciolo, Jr. |
| 6,359,070 B1 | 3/2002 | Khanarian et al. |
| 6,395,070 B1 | 5/2002 | Watanabe et al. |
| 6,444,326 B1 | 9/2002 | Smith |
| 6,511,760 B1 | 1/2003 | Barone et al. |
| 6,620,519 B2 | 9/2003 | Modi |
| 6,752,852 B1 | 6/2004 | Jacksier et al. |
| 7,156,225 B2 | 1/2007 | Jacksier et al. |
| 7,229,667 B2 | 6/2007 | Jacksier et al. |
| 2005/0247196 A1 | 11/2005 | Bensch et al. |
| 2009/0223594 A1 | 9/2009 | Jacksier et al. |

FOREIGN PATENT DOCUMENTS

| | | |
|---|---|---|
| CA | 616981 | 3/1961 |
| CA | 817915 | 7/1969 |
| EP | 0 492 868 A1 | 7/1992 |
| EP | 0517575 A | 12/1992 |
| GB | 1245373 | 9/1971 |
| JP | 53-100979 A | 9/1978 |
| JP | 63-057543 A | 3/1988 |
| JP | 62-49765 A | 9/1994 |
| WO | WO 92/01536 | 2/1992 |
| WO | 9943445 | 2/1999 |
| WO | 03008664 | 1/2003 |

OTHER PUBLICATIONS

Daniels, F. et al., "Absorption of Gases", Experimental Physical Chemistry, 1970, pp. 369-374, Seventh Edition, McGraw-Hill.

Brunauer, S. et al., "Absorption of Gases in Multimolecular Layers", J.Am.Chem.Soc., 1938, 60, pp. 309-316.

Wechter, S.G., "Calibration in Air Monitoring—Preparation of Stable Pollution Gas Standards Using Treated Aluminum Cylinders", ASTM Special Technical Publication 598, 1975, pp. 40-54.

Barrett, E.P., et al., "The Determination of Pore Volume and Area Distributions in Porous Substances", J.Am.Chem.Soc., Jan. 1951, 73, pp. 373-380.

Naffin, B. et al., "Removal of Harmful Acid Gases by Passage through Moistened Lime Filter Layers", Zement-Kalk-Gips Int'l, v 49 n Sep. 9, 1996, 14pp.

REACTIVE GASES WITH CONCENTRATIONS OF INCREASED STABILITY AND PROCESSES FOR MANUFACTURING SAME

CROSS REFERENCE TO RELATED APPLICATIONS

This application is a division of U.S. patent application Ser. No. 11/114,953, filed Apr. 25, 2005 which is a continuation in part application, claiming priority to U.S. patent application Ser. No. 10/157,466, filed May 29, 2002, now abandoned which claims priority from U.S. Provisional Patent Application Ser. Nos. 60/306,014, and 60/306,012, both filed Jul. 17, 2001. This application also claims priority to U.S. Provisional Patent Application Ser. No. 60/541,795, filed Apr. 23, 2004. The disclosures of each of these patent applications are incorporated herein by reference in their entireties.

BACKGROUND OF THE INVENTION

The invention is generally related to the field of gases and packaging and using same. More specifically, the invention relates to increased stability, low concentration reactive gases, products including same, and methods of making same.

Moisture is known to react with so-called "acid gases", such as hydrogen sulfide, carbonylsulfide, carbondisulfide and mercaptans, (mercaptans are also referred to as thiols) to form a complex compound. In addition, it is desirable to remove moisture from so-called "basic gases", such as ammonia, amines, and amides.

A significant problem exists when producing standard reactive gas compositions, in other words, reactive gases having a known concentration of one or more reactive gases in a matrix or carrier fluid. For example, when utilizing so-called "acid gases", such as hydrogen sulfide, carbonylsulfide, carbondisulfide, and mercaptans, (mercaptans are also referred to as thiols) the acid gas will readily react with moisture mixed with the acid gas in a container to form a complex compound and reduce the concentration of the acid gas within the container. Similarly, so-called "basic gases", such as ammonia, amides, and amines, can degrade within a container due to moisture content, and/or other factors, resulting in a reduced concentration of the basic component. A source of reactive gas, and/or matrix gas, may contain a considerable amount of moisture. Therefore, the reduction or removal of moisture from the reactive gas is of primary importance if the stability of the reactive gas in the standard gas is to be maintained. Gas standards may require a long shelf life for the reactive gas, particularly when the standard reactive gas is not utilized immediately or shortly after production.

U.S. Pat. Nos. 5,255,445 and 5,480,677, describe processes for drying and passivating a metal surface to enhance the stability of gas mixtures containing one or more gaseous hydrides in low concentrations in contact therewith. The processes include purging gas in contact with the metal surface, with inert gas to remove the purged gas, exposing the metal surface to an amount of a gaseous passivating, or drying agent comprising an effective amount of a gaseous hydride of silicon, germanium, tin or lead, and for a time sufficient to passivate the metal surface, and purging the gaseous passivating agent using inert gas. Optionally, an oxidizing agent is applied after the third step to stabilize the adsorbed stabilizing agent. The patent also mentions prior known processes, such as saturation passivation, where the container is subjected to several cycles of evacuating and filling with a much higher concentration of the same gaseous hydride, prior to being filled with the low concentration hydride mixture of interest. The two patents do not mention or describe processes to passivate containers adapted to store sulfur-containing gases, nor do they mention passivation techniques in which a first passivating agent is applied to the surface, followed by contacting with a higher concentration of the reactive gas to be stored.

U.S. patent application Ser. No. 10/157,467 (granted U.S. Pat. No. 6,752,852 issued Jun. 22, 2004), filed May 29, 2002, and incorporated herein by reference it its entirety, describes the use of certain acid gas resistant molecular sieves to reduce or remove moisture from fluid compositions comprising a sulfur-containing compound. There is no disclosure or suggestion, however, for the passivation of containers adapted to contain the moisture-reduced compositions. Such containers may have moisture adhered to the internal surfaces, which can and does react with acid gases, reducing their stability and shelf-life.

Given the problem of moisture and/or other factors associated with maintaining concentrations of reactive gases (e.g., acid or basic gases) in containers, it would be advantageous if passivation methods could be provided which increase the shelf-life during the storage of these reactive gas compounds.

SUMMARY OF THE INVENTION

In accordance with the present invention, methods of passivating internal surfaces of containers that have been cleaned are employed to increase the shelf-life of reactive gas compositions, especially low concentration gas products. As used herein, the term "shelf-life", means that time during which the initial concentration of a gas stored in a container is substantially maintained at the intended or desired concentration. In this context, the phrase "substantially maintained", means that for concentrations of no greater than about 10 parts per million (ppm), the concentration does not vary by more than +/−10%; for concentrations of no greater than about 500 parts per billion (ppb), the concentration does not vary by more than +/−15%, for concentrations of no greater than about 100 ppb, the concentration does not vary by more than +/−20%. "Low concentration", means gases having a concentration in another gas, such as inert gas, of 10 ppm or less. For example, ammonia can be substantially maintained within a container at concentrations no greater than about 5 ppm (e.g., concentrations of 1 ppm or less) in accordance with the present invention. Other reactive gases are substantially maintained within a container at concentrations of no greater than about 1,000 ppb (e.g., concentrations of 100 ppb, 75 ppb, 50 ppb, 25 ppb, 10 ppb or less) in accordance with the present invention.

Preferred reactive gases include ammonia, ethanol, methanol, acetone, acetaldehyde, and formaldehyde. Other reactive gases which benefit from the passivation techniques of the present invention include, without limitation, nitrous oxide, nitric oxide, sulfur containing compounds, hydrogen chloride, chlorine, boron trichloride, amines, amides, alcohols, ethers, carbonyl compounds, volatile organic compounds, 2-chlorotoluene, dichlorobenzenes, volatile methyl siloxanes, hexamethyldisiloxane, octamethyltrisiloxane, decamethyltetrasiloxane, dimethylsilicones, 1,1,1,2 tetrafluoroethane, pentafluoroethane, 1,1,2,2, tetrafluoroethane, 1,1,1 trifluoroethane, 1,1 difluoroethane, trichlorofluoromethane, dichlorodifluoromethane, chlorodifluoromethane, trifluoromethane, 1,2 dichloro 1,1,2,2 tetrafluoroethane, chloropentafiluoroethane, 1,1,1 trifluoro 2,2 dichloroethane, parachlorobenzotri-fluoride, cyclic, branched or linear completely methylated siloxanes, per fluorocarbon compounds, xylene, toluene, benzene, ethylbenzene, isopropyl alcohol, butylalcohol, ethylalcohol, methyl alcohol, methyl ethyl ketone, methyl isobutyl ketone, ethylene glycol, glycol ethers, acetamide, acetonitrile, acetopohenone, 2-acetylaminofluoroene, acrolein, acrylamide, acrylic acid, acrolein, aacrylamide, acrylic acid, acrylonitrile, allyl chloride, 4-aminobiphenyl, aniline, o-anisidine, benzidine, benzotrichloride, benzyl chloride, biphenyl, bis(2-ethylhexyl)phthalate, bis(chloromethyl)ether, Bromoform, 1,3-Butadiene, Caprolactam, Captan, Carbaryl, Carbon tetrachloride, Catechol, Carbon disulfide, Chloramben, Chlordane, Chloroacetic acid, 2-Chloroacetophenone, Chlorobenzene, Chlorobenzilate, Chloroform, Chloromethyl methyl ether, Chloroprene, Cresols/Cresylic acid (isomers and mixture), o-Cresol, m-Cresol, p-Cresol, Cumene, 2,4-D, salts and esters, DDE, Diazomethane, Dibenzofurans, 1,2-Dibromo-3-chloropropane, Dibutylphthalate, 1,4-Dichlorobenzene(p), 3,3-Dichlorobenzidene, Dichloroethyl ether (Bis(2-chloroethyl) ether), 1,3-Dichloropropene, Dichlorvos, Diethanolamine, N,N-Diethyl aniline (N,N-Dimethylaniline), N,N-Diethyl aniline (N,N-Dimethylaniline), Diethyl sulfate, Dimethyl aminoazobenzene, 3,3'-Dimethyl benzidine, Dimethyl carbamoyl chloride, Dimethyl formamide, 1,1-Dimethyl hydrazine, Dimethyl phthalate, Dimethyl sulfate, 4,6-Dinitro-o-cresol, and salts, 2,4-Dinitrophenol, 2,4-Dinitrotoluene, 1,4-Dioxane (1,4-Diethyleneoxide), 1,2-Diphenylhydrazine, Epichlorohydrin (I-Chloro-2,3-epoxypropane), 1,2-Epoxybutane, Ethyl acrylate, Ethyl benzene, Ethyl carbamate (Urethane), Ethyl chloride (Chloroethane), Ethylene dibromide (Dibromoethane), Ethylene dichloride (1,2-Dichloroethane), Ethylene glycol, Ethylene imine (Aziridine), Ethylene oxide, Ethylene thiourea, Ethylidene dichloride (1,1-Dichloroethane), Formaldehyde, Heptachlor, Hexachlorobenzene, Hexachlorobutadiene, Hexachlorocyclopentadiene, Hexachloroethane, Hexamethylene-1,6-diisocyanate, Hexamethylphosphoramide, Hexane, Hydrazine, Hydrochloric acid, Hydroquinone, Isophorone, Lindane (all isomers), Maleic anhydride, Methoxychlor, Methyl bromide (Bromomethane), Methyl chloride (Chloromethane), Methyl chloroform (1,1,1-Trichloroethane), Methyl ethyl ketone (2-Butanone), Methyl hydrazine, Methyl iodide (Iodomethane), Methyl isobutyl ketone (Hexone), Methyl isocyanate, Methyl methacrylate, Methyl tert butyl ether, 4,4-Methylene bis(2-chloroaniline), Methylene chloride (Dichloromethane), Methylene diphenyl diisocyanate (MDI), 4,4-Methylenedianiline, Naphthalene, Nitrobenzene, 4-Nitrobiphenyl, 4-Nitrophenol, 2-Nitropropane, N-Nitroso-N-methylurea, N-Nitrosodimethylamine, N-Nitrosomorpholine, Parathion, Pentachloronitrobenzene (Quintobenzene), Pentachlorophenol, Phenol, p-Phenylenediamine, Phosgene, Phosphine, Polychlorinated biphenyls (Aroclors), 1,3-Propane sultone, beta-Propiolactone, Propionaldehyde, Propoxur (Baygon), Propylene dichloride (1,2-Dichloropropane), Propylene oxide, 1,2-Propylenimine (2-Methyl aziridine), Quinoline, Quinone, Styrene, Styrene oxide, 2,3, 7,8-Tetrachlorodibenzo-p-dioxin, 1,1,2,2-Tetrachloroethane, Tetrachloroethylene (Perchloroethylene), Titanium tetrachloride, Toluene, 2,4-Toluene diamine, 2,4-Toluene diisocyanate, o-Toluidine, Toxaphene (chlorinated camphene), 1,2, 4-Trichlorobenzene, 1,1,2-Trichloroethane, Trichloroethylene, 2,4,5-Trichlorophenol, 2,4,6-Trichlorophenol, Triethylamine, Trifluralin, 2,2,4-Trimethylpentane, Vinyl acetate, Vinyl bromide, Vinyl chloride, Vinylidene chloride (1,1-Dichloroethylene), Xylenes (isomers and mixture), o-Xylenes, m-Xylenes, p-Xylenes, Antimony Compounds, arsine, Coke Oven Emissions, Cyanide Compounds, Glycol ethers, Polycylic Organic Matter, and any other reactive gases except those that would react with a silicon-containing compound.

Sulfur-containing compounds that are included in the reactive gases as described above include, without limitation, carbon disulfide, carbonylsulfide, and compounds within formula (I):

wherein S is sulfur,

X and Y are the same or different and are independently selected from the group consisting of hydrogen, alkyl, aryl, oxygen, hydroxyl, amine, aminosilane, and alcohol.

Examples of preferred sulfur-containing compounds within formula (I) include, without limitation:
a) hydrogen sulfide;
b) methylthiol;
c) ethylthiol;
d) n-propylthiol;
e) i-propylthiol;
f) benzylthiol; and
g) the like.

Nitrogen-containing compounds that are included in the reactive gases described above include, without limitation, compounds within the formula (II):

wherein N is nitrogen, and

X, Y and Z are the same or different and are independently selected from the group consisting of:
a) hydrogen;
b) alkyl;
c) aryl;
d) hydroxyl; and
e) carbonyl.

A first aspect of the invention relates to a manufactured product comprising:
a) a container having an internal space and a passivated internal metal surface;
b) a composition comprising a reactive gas contained within the internal space and in contact with the passivated internal metal surface, the reactive gas having an intended concentration that is substantially maintained; and
c) the passivated internal metal surface comprising:
  i) the reaction product of a silicon-containing material and an oxygen-containing material (e.g., selected from the group consisting of water, molecular oxygen, metal oxides, and mixtures thereof); and
  ii) an effective amount of the reactive gas, the effective amount being substantially larger than the intended concentration of reactive gas that is to be substantially maintained.

Manufactured products of the invention may include a reactive gas selected from the group consisting of chlorine and an acid as selected from the group consisting of carbondisulfide, carbonylsulfide, and compounds within formula (I). Other manufactured products of the invention include other reactive gases, such as nitrogen-containing or other basic gases, that are substantially maintained at selected concentrations. Further manufactured products, include products wherein the passivated internal surface is a passivated metal. Preferably, the metal is selected from the group consisting of aluminum, aluminum alloys, steel, iron, and combinations thereof. Yet other manufactured products of the invention are those, wherein the silicon-containing material is selected from the group consisting of compounds within the general formula (III):

$$SiR^1R^2R^3R^4 \quad (III)$$

wherein R1, R2, R3, and R4 are the same or different and are independently selected from the group consisting of hydrogen, halogen, amine, alkyl, aryl, halogenated alkyl, and halogenated aryl; and manufactured products, wherein the compound is silane or a methyl-containing silane, more preferably, wherein the methyl-containing silane is selected from the group consisting of methylsilane, dimethylsilane, trimethylsilane, and tetramethylsilane.

Preferred manufactured products of the invention are those, wherein the reactive gas is ammonia having an initial concentration of about 1 ppm that does not vary by more than +/−16%, or whose relative standard deviation does not exceed about 5.6%.

Preferred manufactured products of the invention comprise only a single reactive gas with an inert gas like nitrogen, argon, helium, and the like. The composition may comprise a mixture of two or more reactive gases. Also, the balance of the fluid composition is, in some preferred embodiments, a hydrocarbon, such as ethylene, propylene, and the like.

A second aspect of the invention is a method of making a manufactured product of the invention, the method comprising the steps of:
a) exposing an internal metal surface of a container to a first fluid composition comprising a silicon-containing compound for a time sufficient to allow at least some of the silicon-containing compound to react with oxygen-containing compounds (preferably selected from the group consisting of water, molecular oxygen, metal oxides, and mixtures thereof) present to form a silicon-treated surface on at least some of the internal metal surface, the silicon-containing compound selected from the group consisting of compounds within the general formula (III):

$$SiR^1R^2R^3R^4 \quad (III)$$

wherein R1, R2, R3, and R4 are the same or different and are independently selected from the group consisting of hydrogen, halogen, alkyl, aryl, amine, halogenated alkyl, and halogenated aryl;
b) evacuating the container for a time sufficient to remove substantially all of the silicon-containing compound(s) that has not reacted with the oxygen-containing compound to form the silicon-treated surface;
c) exposing the silicon-treated surface to a second fluid composition, the second fluid composition comprising a reactive gas having a concentration that is greater than an intended reactive gas concentration of the manufactured product;
d) evacuating the container for a time sufficient to remove just enough of the second fluid composition to enable maintenance of an increased shelf-life, low concentration reactive gas at the intended concentration in the container; and
e) filling the container with a third fluid composition having the intended reactive gas concentration for the manufactured product.

Preferred methods in this aspect of the invention are those wherein the silicon-containing compound is silane, or a methyl-containing organosilane, particularly those wherein the methyl-containing organosilane is selected from the group consisting of silane, methylsilane, dimethylsilane, trimethylsilane and tetramethylsilane. Also preferred, are methods wherein the second fluid composition has a concentration of reactive gas at least 10 times the intended reactive gas concentration of the manufactured product; methods wherein steps i) and ii) are repeated prior to step iii); methods wherein the metal surface is cleaned prior to step i); methods wherein the concentration of the silicon-containing compound used in step i) ranges from about 100 ppm to 100%, methods wherein during step i) the silicon-containing compound is heated to a temperature of not more than 74° C., and methods wherein during step iii) the second composition is heated to a temperature of not more than 74° C. It is noted that second fluid composition that is exposed to the silicon treated surface may include a reactive gas that is different from the reactive gas in the third fluid composition having the intended gas concentration for the manufactured product. However, the reactive gas of the second fluid composition preferably does not interact with the reactive gas of the third fluid composition.

As a further processing step, an inert gas (e.g., nitrogen) may be utilized to purge the container after one or both of the evacuation steps in which the silicon-containing compound and the second composition of reactive gas are removed from the container.

Other preferred methods are those wherein the container is a gas cylinder having an attached cylinder valve, and the cylinder valve is removed prior to step i). After all the steps are completed, preferably at very high temperatures for steps i) and iii), the cylinder valve is reattached, and the process steps i)-v) are repeated, but steps i) and iii) take place at not more than 74° C.

A third aspect of the invention is a method of passivating a metal surface, the method comprising the steps of:
a) exposing the metal surface to a first composition comprising a silicon-containing compound for a time sufficient to allow at least some of the silicon-containing compound to react with oxygen-containing compounds present to form a silicon-treated surface on at least some of the metal surface, the silicon-containing compound selected from the group consisting of compounds within the general formula (III):

$$SiR^1R^2R^3R^4 \quad (III)$$

wherein R1, R2, R3, and R4 are the same or different and are independently selected from the group consisting of hydrogen, halogen, amine, alkyl, aryl, halogenated alkyl, and halogenated aryl;
b) evacuating the surface for a time sufficient to remove substantially all silicon-containing compound that has not reacted with the oxygen-containing compound to form the silicon-treated surface;
c) exposing the silicon-treated surface to a second fluid composition, the second fluid composition comprising a reactive gas having a concentration that is greater than an intended reactive gas concentration to be in contact with the silicon-treated surface;
d) evacuating the surface for a time sufficient to remove just enough of the second fluid composition to enable maintenance of a low concentration of reactive gas at an intended concentration; and
e) exposing the metal treated surface to a third fluid composition having concentration of reactive gas at the intended reactive gas concentration.

Preferably, the metal surface is part of a pipe, piping manifold, tubing, tubing manifold, ton unit, tube trailer, tank trailer, cylinder, flow regulator, pressure regulator, valve, cylinder valve, or other pressure-reducing device. The metal surface is preferably cleaned prior to step i) as disclosed further herein.

Further aspects and advantages of the invention will become apparent by reviewing the description of preferred embodiments that follow.

BRIEF DESCRIPTION OF THE DRAWINGS

For a further understanding of the nature and objects of the present invention, reference should be made to the following detailed description, taken in conjunction with the accompanying drawings, in which like elements are given the same or analogous reference numbers and wherein.

DETAILED DESCRIPTION OF THE PREFERRED EMBODIMENTS

Figure 1:
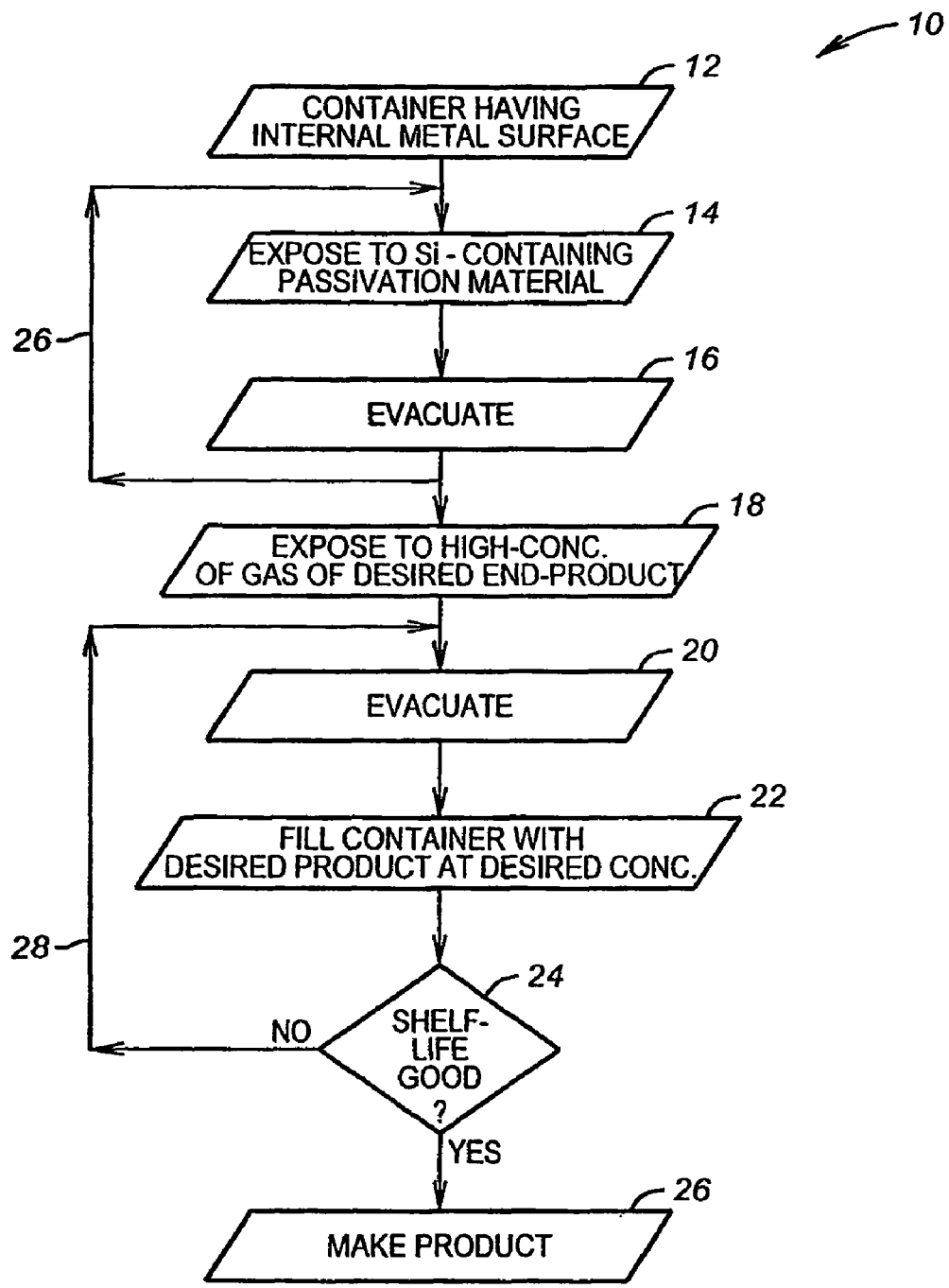
FIG. 1 is a logic diagram illustrating the methods of the invention.

While the following discussion focuses on a container, which has a metal internal surface, the description is not limited thereto, and could apply to a piping or tubing system, a manifold, a gas cylinder having a cylinder valve, ton unit, and the like.

The present invention relates to establishing an increased stability of a reactive gas in a container to facilitate a long shelf life for the gas at a selected concentration. The term "reactive gas", is used herein to denote a chemical compound that is in a gas phase, a liquid phase, or a mixture of gas and liquid phases. The reactive gas may be a Lewis acid compound or a Lewis basic compound.

Preferred reactive gases include ammonia, ethanol, methanol, acetone, acetaldehyde, and formaldehyde. Other reactive gases which benefit from the present invention include, without limitation, nitrous oxide, nitric oxide, sulfur-containing compounds, such as carbon disulfide, carbonylsulfide, and compounds within formula (I), hydrogen chloride, chlorine, boron trichloride, amines, and amides, alcohols, ethers, carbonyl compounds, 2-chlorotoluene, dichlorobenzenes, volatile methyl siloxanes, hexamethyldisiloxane, octamethyltrisiloxane, decamethyltetrasiloxane, dimethylsilicones, 1,1,1,2 tetrafluoroethane, pentafluoroethane, 1,1,2,2, tetrafluoroethane, 1,1,1 trifluoroethane, 1,1 difluoroethane, trichlorofluoromethane, dichlorodifluoromethane, chlorodifluoromethane, trifluoromethane, 1,2 dichloro 1,1,2,2 tetrafluoroethane, chloropentafluoroethane, 1,1,1 trifluoro 2,2 dichloroethane, parachlorobenzotri-fluoride, cyclic, branched, or linear completely methylated siloxanes, per fluorocarbon compounds, xylene, toluene, benzene, ethylbenzene, isopropyl alcohol, butylalcohol, ethylalcohol, methyl alcohol, methyl ethyl ketone, methyl isobutyl ketone, ethylene glycol, glycol ethers, acetamide, acetonitrile, acetopohenone, 2-acetylaminofluoroene, acrolein, acrylamide, acrylic acid, acrolein, aacrylamide, acrylic acid, acrylonitrile, allyl chloride, 4-aminobiphenyl, aniline, o-anisidine, benzidine, benzotrichloride, benzyl chloride, biphenyl, bis(2-ethylhexyl)phthalate, bis(chloromethyl)ether, Bromoform, 1,3-Butadiene, Caprolactam, Captan, Carbaryl, Carbon tetrachloride, Catechol, Carbon disulfide, Chloramben, Chlordane, Chloroacetic acid, 2-Chloroacetophenone, Chlorobenzene, Chlorobenzilate, Chloroform, Chloromethyl methyl ether, Chloroprene, Cresols/Cresylic acid (isomers and mixture), o-Cresol, m-Cresol, p-Cresol, Cumene, 2,4-D, salts and esters, DDE, Diazomethane, Dibenzofurans, 1,2-Dibromo-3-chloropropane, Dibutylphthalate, 1,4-Dichlorobenzene(p), 3,3-Dichlorobenzidene, Dichloroethyl ether (Bis(2-chloroethyl)ether), 1,3-Dichloropropene, Dichlorvos, Diethanolamine, N,N-Diethyl aniline (N,N-Dimethylaniline), N,N-Diethyl aniline (N,N-Dimethylaniline), Diethyl sulfate, Dimethyl aminoazobenzene, 3,3'-Dimethyl benzidine, Dimethyl carbamoyl chloride, Dimethyl formamide, 1,1-Dimethyl hydrazine, Dimethyl phthalate, Dimethyl sulfate, 4,6-Dinitro-o-cresol, and salts, 2,4-Dinitrophenol, 2,4-Dinitrotoluene, 1,4-Dioxane (1,4-Diethyleneoxide), 1,2-Diphenylhydrazine, Epichlorohydrin (I-Chloro-2,3-epoxypropane), 1,2-Epoxybutane, Ethyl acrylate, Ethyl benzene, Ethyl carbamate (Urethane), Ethyl chloride (Chloroethane), Ethylene dibromide (Dibromoethane), Ethylene dichloride (1,2-Dichloroethane), Ethylene glycol, Ethylene imine (Aziridine), Ethylene oxide, Ethylene thiourea, Ethylidene dichloride (1,1 Dichloroethane), Heptachlor, Hexachlorobenzene, Hexachlorobutadiene, Hexachlorocyclopentadiene, Hexachloroethane, Hexamethylene-1,6-diisocyanate, Hexamethylphosphoramide, Hexane, Hydrazine, Hydrochloric acid, Hydroquinone, Isophorone, Lindane (all isomers), Maleic anhydride, Methoxychlor, Methyl bromide (Bromomethane), Methyl chloride (Chloromethane), Methyl chloroform (1,1,1-Trichloroethane), Methyl ethyl ketone (2-Butanone), Methyl hydrazine, Methyl iodide (Iodomethane), Methyl isobutyl ketone (Hexone), Methyl isocyanate, Methyl methacrylate, Methyl tert butyl ether, 4,4-Methylene bis(2-chloroaniline), Methylene chloride (Dichloromethane), Methylene diphenyl diisocyanate (MDI), 4,4-Methylenedianiline, Naphthalene, Nitrobenzene, 4-Nitrobiphenyl, 4-Nitrophenol, 2-Nitropropane, N-Nitroso-N-methylurea, N-Nitrosodimethylamine, N-Nitrosomorpholine, Parathion, Pentachloronitrobenzene (Quintobenzene), Pentachlorophenol, Phenol, p-Phenylenediamine, Phosgene, Phosphine, Polychlorinated biphenyls (Aroclors), 1,3-Propane sultone, beta-Propiolactone, Propionaldehyde, Propoxur (Baygon), Propylene dichloride (1,2-Dichloropropane), Propylene oxide, 1,2-Propylenimine (2-Methyl aziridine), Quinoline, Quinone, Styrene, Styrene oxide, 2,3, 7,8-Tetrachlorodibenzo-p-dioxin, 1,1,2,2-Tetrachloroethane, Tetrachloroethylene (Perchloroethylene), Titanium tetrachloride, Toluene, 2,4-Toluene diamine, 2,4-Toluene diisocyanate, o-Toluidine, Toxaphene (chlorinated camphene), 1,2, 4-Trichlorobenzene, 1,1,2-Trichloroethane, Trichloroethylene, 2,4,5-Trichlorophenol, 2,4,6-Trichlorophenol, Triethylamine, Trifluralin, 2,2,4-Trimethylpentane, Vinyl acetate, Vinyl bromide, Vinyl chloride, Vinylidene chloride (1,1-Dichloroethylene), Xylenes (isomers and mixture), o-Xylenes, m-Xylenes, p-Xylenes, Antimony Compounds, arsine, Coke Oven Emissions, Cyanide Compounds, Glycol ethers, Polycylic Organic Matter, and any other reactive gases that are preferably nonreactive with silicon-containing compounds. Examples of preferred sulfur-containing compounds within formula (I) include, without limitation, hydrogen sulfide, methylthiol, ethylthiol, n-propylthiol, i-propylthiol, benzylthiol, and the like.

Silicon-containing compounds within the general formula (III) are known to react with oxygen-containing compounds, such as $H_2O$, $N_2O$, $CO_2$, and the like, to produce $SiO_2$, especially when the silicon-containing compounds are in the gaseous or vapor state. This fact is taken advantage of in the practice of the various aspects of the invention. The reaction product of a silicon-containing compound and an oxygen-containing compound such as water forms an amorphous or crystalline glassy material on the surfaces on which it is deposited. The amorphous or crystalline glassy material may include aluminum silicide, if the container or surface being treated comprises aluminum. Although the deposited material is referred to herein as a "coating", it shall be readily understood that in fact the material may deposit non-uniformly, or not at all on certain areas of the surface being treated. This coating then serves the function of deactivating a surface for the adsorption of molecules of the gas that is ultimately to be contained in the container or piping system at low concentration. In other words, the coating serves to decrease the number of reactive sites on the metal surface being treated. For simplicity, silicon-containing compounds within formula (III) shall be referred to as organosilanes, although their formal name under IUPAC convention may differ.

The reaction of an organosilane within general formula (III) with oxygen-containing materials such as water proceeds without catalyst at room temperature (25° C.), however, it is preferred to carry out the reaction at moderately elevated temperatures, such as temperature ranging from 25° C. up to 100° C., in order to produce the coatings in a reasonable time. The pressure of the reaction of an organosilane with water vapor will generally, also proceed at atmospheric pressure, however, the pressure in the container, or near the surface being treated, may either be in vacuum or above atmospheric pressure. This will, of course, depend on the rates of reaction of the organosilane with the oxygen-containing compound, the desired coating deposition rate, and desired thickness of the coating. It is, of course, within the invention to make layered coatings of two or more organosilane/oxygen-containing compound reaction products. It is also considered within the invention to employ two or more organosilanes simultaneously to make a "mixed" coating. Indeed, it is possible that the organosilane may be employed in conjunction with a non-organosilane to form either layered or mixed coatings.

Typically, the reaction step is conducted with 1% silane at 100 psi for a period of time of about 12-24 hours.

Silane and organosilanes are toxic materials, and, depending on the organosilane, pyrophoric. Special care in handling these materials is warranted, preferably well-ventilated hoods. Electronic grade silane ($SiH_4$) is available commercially in cylinders from Air Liquide America Corporation, Houston, Tex. Trimethylsilane is available commercially from Dow Corning Corporation.

Preferred silicon-containing compounds include silane, and methyl-containing organosilanes, particularly those wherein the methyl-containing organosilane is selected from the group consisting of methylsilane, dimethylsilane, trimethylsilane and tetramethylsilane. Preferred organosilane compounds include methylsilane compounds having the structure $SiH_n(CH_3)_{4-n}$, where n=1 to 3, i.e. methylsilane, dimethylsilane, or trimethylsilane, or the structure $Si_2H_m(CH_3)_{6-m}$, where m=1 to 5. The most preferred organosilane compound is methylsilane, $CH_3SiH_3$. The organosilane compounds are hydrolyzed by reaction with water, oxygen or water-containing gases such as humid air and/or other oxygen-containing gases, such that the carbon content of the deposited film is from 1 to 50% by atomic weight, preferably about 20%.

It is conceivable to employ adjuvants during the reaction of an organosilane with water. In the practice of the invention, "adjuvant" includes physical and chemical adjuvants, and combinations thereof. Suitable physical adjuvants include electrostatic discharge, plasma discharge, laser excitation, and the like, under temperatures and pressures suitable for each of these processes. For example, plasmas are preferably best employed in moderate vacuum. A chemical adjuvant might include an oxidant gas such as oxygen, ozone, chlorine dioxide, combinations thereof, and the like. When a combination of physical and chemical adjuvants is employed, for example ozone and plasma discharge, the reaction product may be described as similar to the films produced by the process described in U.S. Pat. No. 6,054,379, which is incorporated herein by reference for its teaching of the production of such films.

The container or surface to be treated may be selected from the group consisting of iron, stainless steel (for example 301, 316, 401), aluminum, aluminum alloy, steel alloys and the like. The internal surface of the container, or the surface to be treated, may be subject to abrasion prior to reaction of the organosilane with water vapor in order to improve adhesion of the reaction product to the metal. Residues may be removed by a variety of mechanical means such as scrubbing, grinding, and peening. Scrubbing may be performed with non-woven abrasives. The use of lofty, fibrous, nonwoven abrasive products for scouring surfaces such as the soiled surfaces of pots and pans is well known. These products are typically lofty, nonwoven, open mats formed of staple fibers which are bonded together at points where they intersect and contact each other. The staple fibers of low-density abrasive products of this type can be, and typically are, bonded together at points of contact with a binder that may or may not contain abrasive particles. The staple fibers are typically crimped, have a length of about 3.8 cm, a diameter ranging from about 25 to about 250 micrometers, and are formed into lofty open webs by equipment such as "Rando-Webber", and "Rando-Feeder" equipment (marketed by the Curlator Corporation, of Rochester, N.Y., and described in U.S. Pat. Nos. 2,451,915, 2,700,188, 2,703,441, and 2,744,294). One very successful commercial embodiment of such an abrasive product is that sold under the trade designation "Scotch-Brite" by Minnesota Mining and Manufacturing Company of St. Paul, Minn. ("3M"). Low-density abrasive products of this type can be prepared by the method disclosed by Hoover et al. in U.S. Pat. No. 2,958,593, incorporated herein by reference.

Low-density, lofty abrasive products may also be formed of webs or mats of continuous filaments. For example, in U.S. Pat. No. 4,227,350, Fitzer, incorporated herein by reference, discloses a low-density abrasive product comprising a uniform cross-section, generally flat-surfaced, open, porous, lofty web of autogenously bonded, continuous, undulated, interengaged filaments. The web of Fitzer is formed by downwardly extruding a plurality of thermoplastic organic (e.g. polyamide, polyester) filaments from a spinneret into a quench bath. As the filaments enter the quench bath, they begin to coil and undulate, thereby setting up a degree of resistance to the flow of the molten filaments, causing the molten filaments to oscillate just above the bath surface. The spacing of the extrusion openings from which the filaments are formed is such that, as the molten filaments coil and undulate at the bath surface, adjacent filaments touch one another. The coiling and undulating filaments are still sufficiently tacky as this occurs, and, where the filaments touch, most adhere to one another to cause autogenous bonding to produce a lofty, open, porous, handlable filament web. The web, so formed, is then impregnated with a tough binder resin which adherently bonds the filaments of the web together and also bonds a multitude of abrasive granules, uniformly dispersed throughout the web, to the surface of the filaments. Fibrous polishing and/or abrading materials can be prepared from continuous or substantially continuous synthetic filaments by the method disclosed by Zimmer et al., in U.S. Pat. No. 3,260,582, incorporated herein by reference. In this method crimped or curled continuous filaments are straightened out under tension into a substantially parallel relationship with one another, uniformly coated while under tension with an adhesive which may or may not contain abrasive particles, interlocked with one another by release of such tension and then set in a permanently interlocked and lofty, open, 3-dimensional state by curing or setting up the adhesive. Low-density, lofty, open, porous, nonwoven scouring articles have been more easily and economically manufactured from continuous filaments by the method disclosed by Heyer et al., in U.S. Pat. Nos. 4,991,362, and 5,025,596, both incorporated herein by reference. The scouring pads described in these patents comprise a multiplicity of crimped or undulated, continuous, thermoplastic organic filaments that are bonded together (e.g., by fusion or an adhesive) at opposite ends. The pad is made by arranging a multiplicity of continuous, crimped or undulated, thermoplastic organic filaments in an open lofty array, with one point of each filament in the array corresponding to a first filament bonding site, and a second point of each filament, distant from the first point, corresponding to a second filament bonding site. A pad is formed in the filament array by bonding substantially all of the thermoplastic organic filaments together at the first and second bonding sites. When a pad having greater abrasiveness is desired, abrasive particles may be adherently bonded to the filaments of the pad, preferably before the individual pad is cut from the filament array. These pads have also enjoyed commercial success and are economical to make. U.S. Pat. No. 5,363,604, incorporated by reference, describes nonwoven scouring articles comprising a low-density, lofty, open, porous, nonwoven web, the web comprising a multiplicity of crimped or undulated, continuous, preformed thermoplastic organic filaments, at least partially coated with an organic thermoset binder which binds the filaments at least at a portion of points where they contact. The continuous thermoplastic organic filaments, preferably in the form of tow, are entangled together at a multiplicity of points along their length to provide a cross-direction tensile strength the web of at least about 0.02 kg/cm, more preferably at least about 0.03 kg/cm, before coating the web with a thermosetting binder precursor solution. The continuous filaments are "entangled", preferably by needlepunching from a plurality of directions perpendicular to the machine direction. Other background references include U.S. Pat. Nos. 3,688,453, 4,622,253, 4,669,163, 4,902,561, 4,927,432, 4,931,358, 4,935,295, World Patent Application No. WO 92/01536, published Feb. 6, 1992, and European Patent Application No. 0 492 868 A1, published Jul. 1, 1992, the disclosures, that of which, are incorporated herein by reference.

Other means of removing residues from metal surfaces include grinding, such as by using so-called bonded abrasives. Bonded abrasives typically consist of a shaped mass of abrasive grains held together by a binder. The shaped mass can be in any number of conventional forms such as wheels, points, discs, and cylinders, but is preferably in the form of a grinding wheel. A preferred bonded abrasive product useful in the present invention comprises between about 50 to about 90 weight % abrasive grains dispersed and adhered within a binder. Bonded abrasives products are preferably manufactured by a molding process, and are made with varying degrees of porosity to control the breakdown. Bonded abrasives, which may be used for this purpose are such as those described in U.S. Pat. Nos. 5,250,085, 5,269,821, and 5,273,558, all incorporated herein by reference. Abrasive products comprising a solid or foamed organic polymeric matrix having abrasive granules dispersed throughout and bonded therein are well known and widely used. Typically, the polymeric matrix is composed of either a hard, thermoset resin, such as a catalyzed phenol-formaldehyde, or resilient elastomer, such as a polyurethane or a vulcanized rubber.

Bonded abrasives are to be distinguished from coated abrasives in their construction and mode of operation. Bonded abrasives (e.g., grinding wheels) are three-dimensional structures of binder and abrasive grains which rely upon the continual breakdown and removal of the abrasive grains on the cutting surface to continually present sharp cutting points to the material being ground. Coated abrasives, on the other hand, typically have only a single layer of abrasive grains. See, for example, U.S. Pat. No. 5,011,512, incorporated herein by reference.

When elastomeric binder matrices are used in bonded abrasives they generally produce an abrasive article having some degree of flexibility and resiliency. These abrasive articles typically provide a smoother abrasive action and a finer surface finish than that provided by a bonded abrasive article made with hard, thermoset resin. As a result of this, elastomeric bonded abrasive articles have found a wide range of industrial applications, such as deburring, finishing, and sanding in the metal and wood-working industries. However, often these elastomeric bonded abrasive articles have shown premature loss of abrasive particles and, in some cases, undesirable smearing or transfer of portions of the elastomeric binder to the surface of the workpiece.

Conventional flexible bonded abrasive articles typically employ an elastomeric polyurethane as the binder matrix. The polyurethane binder matrix may be a foam, as disclosed in U.S. Pat. Nos. 4,613,345, 4,459,779, 2,972,527, 3,850,589, UK Patent Specification No. 1,245,373 (published Sep. 8, 1971), or the polyurethane binder may be a solid, as disclosed in U.S. Pat. Nos. 3,982,359, 4,049,396, 4,221,572, and 4,933,373, all incorporated herein by reference.

For very large containers, such as ton units, bullets, and spheres, peening may be used with success to remove residues, scales and other deposits on internal surfaces of these containers. U.S. Pat. Nos. 3,638,464 and 3,834,200, incorporated herein by reference, disclose a high-intensity peening flap construction, which includes an elongate strap of a flexible, tear-resistant material, and at least one metal peening particle support base fastened to the elongate strap. A plurality of refractory-hard, impact fracture-resistant, peening particles, are metallurgically joined to an exposed face of the support base. In use, one or more of the flaps are mounted on a hub, and the hub is rotated while the flaps are forced against the workpiece to be peened. The peening particles on each support base strike the workpiece in turn, thereby causing the peening particles to perform their normal peening function, but preventing the normal uncontrolled scattering which occurs in conventional shot peening. Improvements to these articles are described in U.S. Pat. Nos. 5,179,852 and 5,203,189, incorporated herein by reference where necessary to understand their use in removing residues.

Preferably, the cleaned container is vacuum-baked at a temperature ranging from about 30° C. to about 75° C. for no less than 1 hour (preferably no less than 6 hours, more preferably no less than 12 hours), at a vacuum no more than 100 torr, preferably no more than 1 torr, and more preferably, no more than 0.01 torr), to form a vacuum-baked internal metal surface of the container.

Once the metal container inner surface, or metal surface to be treated is cleaned, and the reaction of organosilane with oxygen-containing compounds completed, either with or with out adjuvants, to form a coating, the processes of the invention comprise evacuating the container for a time and vacuum sufficient to remove substantially all organosilane that has not reacted with oxygen-containing compounds. This first evacuation step preferably, includes evacuation down to a vacuum of about 1 torr, more preferably, down to 0.01 torr. The temperature during this evacuation process is not critical, but higher temperatures may tend to increase the removal rate of organosilane. This will be balanced by safety issues, in that higher temperatures may be more hazardous. Therefore, room temperature (about 25° C.), or slightly lower, or slightly higher than room temperature, is preferred. Preferably, after application of vacuum, the container is flushed with an inert gas such as nitrogen, typically at a pressure of about 100 psi and for a period of time of about 30 minutes. Most preferably, the container is subjected to alternating applications of vacuum and inert gas purges. Preferably, three sets of vacuum application and inert gas purge is performed.

Subsequent to this first evacuation step, the next step is exposing the coating to a gas composition, the gas composition having a concentration of reactive gas that is greater than an intended reactive gas concentration of a manufactured product. Typical balance gases in the gas composition include nitrogen (especially for ammonia reactive gas), and ethane (especially for ethanol, methanol, acetone, acetaldehyde, and formaldehyde). The reactive gas is caused to contact the coating and deactivate the surface even further. The reactive gas preferably has a concentration of at least 10 times the concentration of the reactive gas that is to be ultimately stored in the container or exposed to the surface, and more preferably, has a concentration 500 times greater than the ultimate concentration, even more preferably, 50,000 times the concentration of the reactive gas to be stored in the container or exposed to the surface. In the case of ammonia reactive gas, about 5,000 ppm, ammonia at about 100 psi is used. It is noted that the reactive gas utilized to deactivate the surface of the container even further may or may not be the same as the final reactive gas to be ultimately stored within the container and substantially maintained at the desired concentration. However, when utilizing a different reactive gas to further deactivate the container surface, it is noted that this reactive gas preferably does not interact with the final reactive gas to be stored in the container. The high concentration reactive gas is preferably maintained in the container for a period of about 1-7 days, preferably about 7 days.

The degree of adsorption of the reactive gas onto the coating depends in a complicated way on the composition and physical properties of the coating, the temperature and pressure employed during this step, as well as on the chemical and physical properties of the particular reactive gas that is being adsorbed thereon. These parameters are in turn dictated by the final concentration of reactive gas that is to be stored in the container. A discussion of adsorption of gaseous species onto surfaces that is helpful in this respect is included in Daniels, F., et al., "Experimental Physical Chemistry", Seventh Edition, McGraw-Hill, pages 369-374 (1970). While the inventors are not certain, it is believed that the attraction of the reactive gas to the coating is physical in nature, involving an interaction of dipoles or induced dipoles, but may be chemical in nature involving chemical bonds, as when oxygen is adsorbed on charcoal. A combination of physical and chemical forces may be at work as well. Thus, the surface area of a coating produced by the practice of the present invention may be determined by the B.E.T. method, and preferably, is at least about 1 $m^2$/gram, more preferably, at least 10 $m^2$/gram. If the coating is somewhat porous, the pore volume may be determined by nitrogen adsorption isotherm methods, and is preferably at least 0.1 ml/gram. The B.E.T. method is described in detail in Brunauer, S. Emmet, P. H., and Teller, E., J. Am. Chem. Soc., 60, 309-16 (1938). The nitrogen adsorption isotherm method is described in detail in Barrett, E. P., Joyner, L. G. and Helenda, P. P., J. Am. Chem. Soc., 73, 373-380 (1951), incorporated by reference herein. In general, if the concentration of reactive gas to be stored in the container is 100 ppb, then for the same reactive gas, same temperature and pressure, and same coating, the concentration of reactive gas used in this step will be higher than if the ultimate concentration of reactive gas is to be only 50 ppb, assuming adsorption is the governing pathway. An increase in temperature will tend to require an increase in concentration of reactive gas, an increase in pressure, or both, to achieve the same degree of adsorption. In contrast, a decrease in temperature will tend to require a decreased concentration of reactive gas, a decrease in pressure, or both to achieve the same level of adsorption.

After the surface has been further deactivated by exposure to the reactive gas at high concentration, a second evacuation step is carried out to remove excess reactive gas. In this step, evacuation of the container is carried out for a time sufficient to remove substantially all of non-adsorbed reactive gas, leaving reactive gas adsorbed on the coating. The container is then filled with a gas composition comprising the intended low concentration of reactive gas. Preferably, an inert gas such as nitrogen is used to alternatingly purge the container after each application of vacuum, as described in greater detail above.

Referring now to FIG. 1, there is illustrated schematically a logic diagram for carrying out processes of the invention. A container having a metal internal surface is selected at 12. The metal surface is exposed to a silicon-containing passivation material, 14, for a time and at a temperature and pressure sufficient to react most of the silicon-containing material with oxygen-containing compounds present on the metal surface. The container is then evacuated for a time sufficient to remove the bulk of the non-reacted silicon-containing material, at 16. Next, the metal surface is exposed to high concentration of reactive gas or liquid of the desired end product to be contained in the container, at 18. The container is again evacuated at 20 for a time sufficient to remove substantially all of the non-adsorbed reactive gas, then the container is filled with the composition having the desired material at the desired concentration, at 22. At this point, the container is allowed to equilibrate and the concentration of the gas in the container is tested at various times to determine the concentration of reactive gas in the container. If the shelf life is acceptable at 24, the product is made in accordance with the procedure followed, at 26. If the concentration of the gas increases or decreases beyond the accepted tolerances, then the process of steps 20, 22, and 24, are repeated. Optionally, steps 14 and 16 may be repeated, as indicated at 26. It is noted that the methods of the present invention will yield manufactured products where the final reactive gas concentration that is substantially maintained within the container can be in the range of below about 10 ppm.

EXAMPLES

In the following examples, hydrogen sulfide concentrations were measured using a chemiluminescence detector. Ammonia concentrations were measured using an APNA-360 analyzer from Horiba. It was equipped with an $NH_3$ converter that converts $NH_3$ into NO, which is then detected by the analyzer. Each of the ethanol, methanol, acetone, and acetaldehyde concentrations were measured using a GC from Varian (model CP-3800) with a Varian FID (Flame Ionization Detector). The column used was a Varian CP-LowOx (10 m×0.53 mm).

Comparative Example 1

Figure 2:
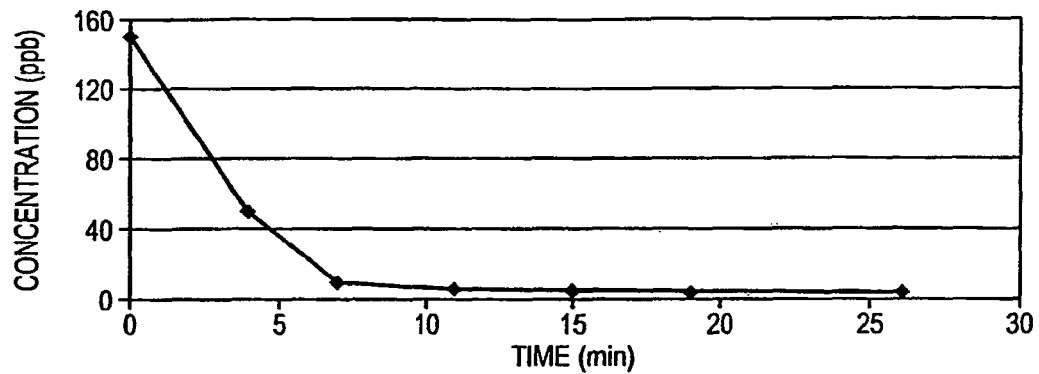
FIG. 2 illustrates that a prior art process of "vacuum baking" an aluminum cylinder at 65° C. to vacuum of 1 micrometer Hg for 3 days was not sufficient to provide stability of a 150 ppb $H_2S$ balance nitrogen mixture for a cylinder which was previously exposed to moisture.

Vacuum baking has long been employed to reduce moisture in cylinders to prevent and/or decrease corrosion due to acid as reactions with moisture and the cylinder wall (and cylinder valve). However, as illustrated in FIG. 2, vacuum baking an aluminum cylinder at 65° C. to vacuum of 1 micrometer of Hg for 3 days was not sufficient to provide stability of a 150 ppb $H_2S$ balance nitrogen mixture for a cylinder which was previously exposed to moisture.

Comparative Example 2

Figure 3:
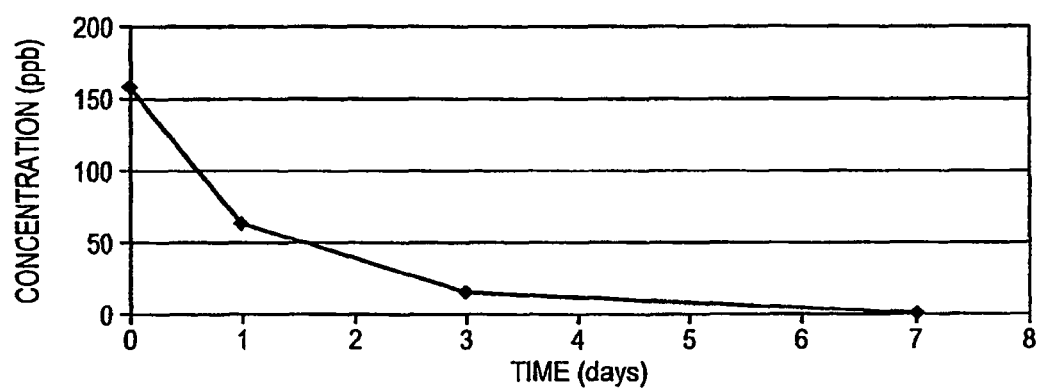
FIG. 3 illustrates that a prior art process of passivation of a cylinder and valve after vacuum baking with a high concentration of the gas mixture to be prepared, which had also been used to extend shelf life of a high purity mixture, did not prove successful.

Passivation of the cylinder and valve after vacuum baking with a high concentration of the gas mixture to be prepared has also been used to extend shelf life of high purity mixtures. However, this has not proved successful. After an initial vacuum baking as in Comparative Example 1, the cylinder was subsequently filled with 5,000 ppm of $H_2S$ balance nitrogen and heated at 80° C. for 3 days. After 3 days the contents were emptied and a vacuum pulled on the cylinder in order to remove all residual $H_2S$. The cylinder was subsequently filled with 150 ppb $H_2S$ balance nitrogen. As illustrated in FIG. 3, although the stability of the mixture was enhanced, a fast decay was still observed.

Example 1

Figure 4:
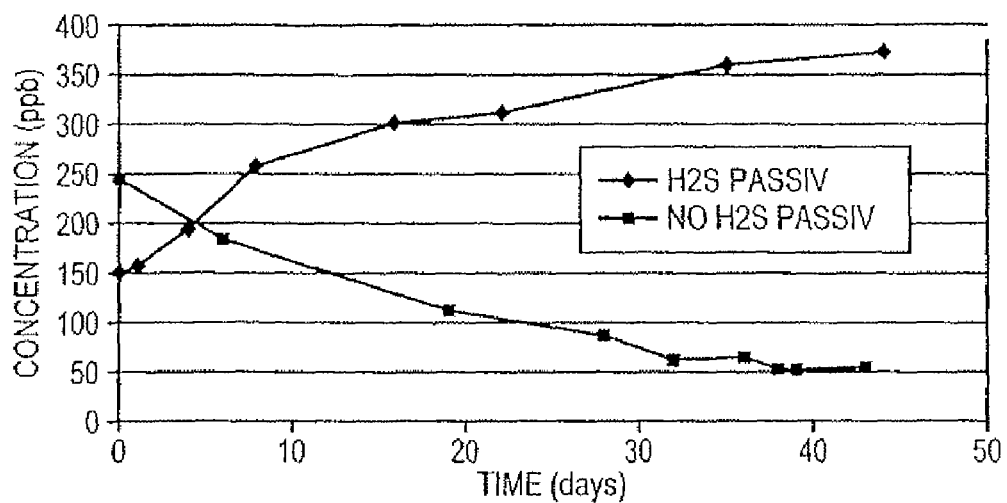
FIGS. 4 and 5 illustrate stability of gas products made in accordance with the invention.

Silane, a silicon-containing material having the formula $SiH_4$, is known to react with moisture, and other oxygen-containing compounds and hydrogen. It has also been reported that $SiO_2$ can bind to aluminum, and we have data indicating formation of weak Si—Al bonds when treating an aluminum alloy cylinder known under the trade designation "Calgaz 3003". In this example, a 1% silane balance nitrogen mixture was introduced into an aluminum cylinder (note: this was not a cylinder known under the trade designation "Calgaz 3003") and left in the cylinder overnight. Subsequently, the balance was vacuumed out and the cylinder was filled with a 250 ppb $H_2S$ balance nitrogen mixture. As illustrated in FIG. 4, the signal decay for the curve labeled "No $H_2S$ Passiv" was slower than observed previously, indicating that the reaction of moisture with the $H_2S$ was not solely responsible for the loss of stability of the $H_2S$. The cylinder was subsequently evacuated and passivated with a 5,000 ppm mixture of $H_2S$ at 62° C. The cylinder was evacuated and filled with 150 ppb $H_2S$. The signal was observed to increase with time, indicating that substantially all of the passivation mixture had not been removed prior to filling.

Example 2

Figure 5:
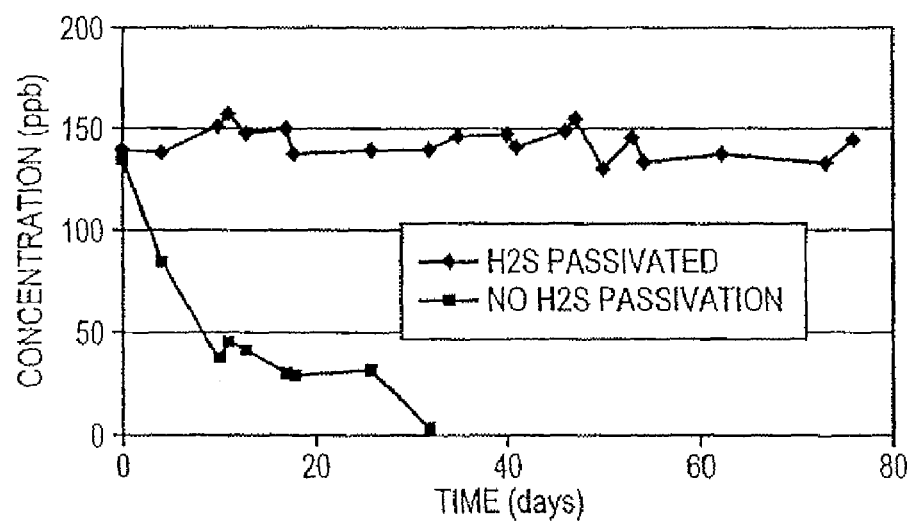

Applying the same silane treatment followed by $H_2S$ passivation as in Example 1, but using a longer vacuum time period to remove extraneous silane, it was possible to achieve a stable $H_2S$ mixture, as illustrated in FIG. 5 by the curve labelled "H2S Passivated". For Comparative Examples 3 and 4, and Examples 3 and 4, the ammonia concentrations were measured with an analyzer from Horiba model number APNA-360. This analyzer was equipped with a NH3 converter that converts NH3 into NO, which is then detected by the APNA-360 analyzer.

Comparative Example 3

Cylinder 178159

A vacuum was applied to a cylinder to evacuate the contents. The cylinder was subsequently filled with 5,000 ppm of ammonia at about 100 psi and maintained for 7 days. After 7 days the contents were emptied and a vacuum pulled on the cylinder in order to remove all residual ammonia. The cylinder was subsequently filled with 10 ppm ammonia and diluted with nitrogen to achieve a final ammonia concentration of 1.046 ppm. The concentration was measured over a period of six months.

TABLE I

Ammonia Measurements for Comparative Example 3

| Date | Time (days) | NH3 Conc (ppm) |
|---|---|---|
| Oct. 20, 2004 | 0 | 1.046 |
| Nov. 5, 2004 | 16 | 0.000 |
| Nov. 10, 2004 | 21 | 0.045 |
| Nov. 15, 2004 | 26 | 0.065 |
| Dec. 13, 2004 | 54 | 0.024 |
| Jan. 06, 2005 | 78 | 0.028 |
| Feb. 10, 2005 | 113 | 0.031 |
| Feb. 16, 2005 | 119 | 0.028 |
| Feb. 23, 2005 | 126 | 0.021 |
| Mar. 22, 2005 | 153 | 0.007 |
| Apr. 11, 2005 | 173 | 0.015 |

TABLE II

Stability of Ammonia for Comparative Example 3

| Months | Average NH3 Conc (ppm) | % RSD | Variation | % Variation |
|---|---|---|---|---|
| 6 | 0.981 | 5.422 | 0.179 | 17.113 |
| 5 | 0.993 | 3.957 | 0.111 | 10.612 |
| 4 | 0.998 | 3.836 | 0.111 | 10.612 |
| 3 | 1.012 | 3.373 | 0.061 | 5.832 |
| 2 | 1.017 | 3.487 | 0.061 | 5.832 |
| 1 | 1.022 | 3.786 | 0.061 | 5.832 |

Comparative Example 4

Cylinder 178145

A cylinder was evacuated, and then subsequently filled with 10 ppm ammonia and diluted with nitrogen to achieve a final ammonia concentration of 0.961 ppm.

TABLE III

Ammonia Measurements for Comparative Example 4

| Date | Time (days) | NH3 conc. (ppm) |
|---|---|---|
| Oct. 20, 2004 | 0 | 0.961 |
| Nov. 5, 2004 | 16 | 0.000 |
| Nov. 10, 2004 | 21 | 0.045 |
| Nov. 15, 2004 | 26 | 0.065 |
| Dec. 13, 2004 | 54 | 0.024 |
| Jan. 6, 2005 | 78 | 0.028 |
| Feb. 10, 2005 | 113 | 0.031 |
| Feb. 16, 2005 | 119 | 0.028 |
| Feb. 23, 2005 | 126 | 0.021 |
| Mar. 22, 2005 | 153 | 0.007 |
| Apr. 11, 2005 | 173 | 0.015 |

TABLE IV

Stability of Ammonia for Comparative Example 4

| Months | Average NH3 Conc (ppm) | % RSD | Variation | % Variation |
|---|---|---|---|---|
| 6 | 0.808 | 12.382 | 0.309 | 32.154 |
| 5 | 0.824 | 10.962 | 0.024 | 2.466 |
| 4 | 0.835 | 10.585 | 0.200 | 20.812 |
| 3 | 0.871 | 10.100 | 0.177 | 18.418 |
| 2 | 0.888 | 9.677 | 0.161 | 16.753 |
| 1 | 0.910 | 8.921 | 0.128 | 13.319 |

Example 3

Cylinder 178348

A vacuum was applied to a cylinder to evacuate the contents. It was then filled with 1% silane in nitrogen at 100 psi and maintained overnight. Next, three sets of evacuation and nitrogen purges were performed with the nitrogen at about 100 psi and maintained 5 for 30 minutes. The cylinder was subsequently filled with 5,000 ppm of ammonia at about 100 psi and maintained for 7 days. After 7 days the contents were emptied and a vacuum pulled on the cylinder in order to remove all residual ammonia. The cylinder was subsequently filled with 10 ppm ammonia and diluted with nitrogen to achieve a final ammonia concentration of 1.027 ppm.

TABLE V

Ammonia Measurements for Example 3

| Date | Time (days) | NH3 conc. (ppm) |
|---|---|---|
| Oct. 20, 2004 | 0 | 1.027 |
| Nov. 5, 2004 | 16 | 0.000 |
| Nov. 10, 2004 | 21 | 0.045 |
| Nov. 15, 2004 | 26 | 0.065 |
| Dec. 13, 2004 | 54 | 0.024 |
| Jan. 6, 2005 | 78 | 0.028 |
| Feb. 10, 2005 | 113 | 0.031 |
| Feb. 16, 2005 | 119 | 0.028 |
| Feb. 23, 2005 | 126 | 0.021 |
| Mar. 22, 2005 | 153 | 0.007 |
| Apr. 11, 2005 | 173 | 0.015 |

TABLE VI

Stability of Ammonia for Example 3

| Months | Average NH3 Conc (ppm) | % RSD | Variation | % Variation |
|---|---|---|---|---|
| 6 | 0.989 | 5.063 | 0.159 | 15.482 |
| 5 | 1.001 | 3.164 | 0.070 | 6.816 |
| 4 | 1.006 | 2.909 | 0.048 | 4.674 |
| 3 | 1.018 | 2.886 | 0.045 | 4.382 |
| 2 | 1.025 | 2.595 | 0.039 | 3.797 |
| 1 | 1.029 | 2.821 | 0.039 | 3.797 |

Example 4

Cylinder 178198

A vacuum was applied to a cylinder to evacuate the contents. It was then filled with 1% silane in nitrogen at 100 psi and maintained overnight. Next, three sets of evacuation and nitrogen purges were performed with the nitrogen at about 100 psi and maintained for 30 minutes. The cylinder was subsequently filled with 5,000 ppm of ammonia at about 100 psi and maintained for 7 days. After 7 days the contents were emptied and a vacuum pulled on the cylinder in order to remove all residual ammonia. The cylinder was subsequently filled with 10 ppm ammonia and diluted with nitrogen to achieve a final ammonia concentration of 1.036 ppm.

TABLE VII

Ammonia Measurements for Example 4

| Date | Time (days) | NH3 conc. (ppm) |
|---|---|---|
| Oct. 20, 2004 | 0 | 1.036 |
| Nov. 5, 2004 | 16 | 0.000 |
| Nov. 10, 2004 | 21 | 0.045 |
| Nov. 15, 2004 | 26 | 0.065 |
| Dec. 13, 2004 | 54 | 0.024 |
| Jan. 06, 2005 | 78 | 0.028 |
| Feb. 10, 2005 | 113 | 0.031 |
| Feb. 16, 2005 | 119 | 0.028 |
| Feb. 23, 2005 | 126 | 0.021 |
| Mar. 22, 2005 | 153 | 0.007 |
| Apr. 11, 2005 | 173 | 0.015 |

TABLE VIII

Stability of Ammonia for Example 4

| Months | Average NH3 Conc (ppm) | % RSD | Variation | % Variation |
|---|---|---|---|---|
| 6 | 1.024 | 5.629 | 0.124 | 11.969 |
| 5 | 1.035 | 4.498 | 0.094 | 9.073 |
| 4 | 1.043 | 4.085 | 0.094 | 9.073 |
| 3 | 1.061 | 3.851 | 0.094 | 9.073 |
| 2 | 1.072 | 3.280 | 0.094 | 9.073 |
| 1 | 1.075 | 3.701 | 0.094 | 9.073 |

For Comparative Examples 5 and 6, and Example 5, the Methanol, Ethanol, Acetone, and Acetaldehyde were measured with a GC from Varian model CP-3800 with a Varian FID (Flame Ionization Detector). The column used for this analysis was a Varian CP-LowOx (10 m×0.53 mm).

Comparative Example 5

Cylinder 160585

A cylinder which had been previously passivated with 100 ppb each of methanol and ethanol (for one month) was subjected to three-five cycles of vacuum (evacuation) and nitrogen purging. It was subsequently filled with methanol, ethanol, acetone, and acetaldehyde and diluted with ethylene in ethylene to achieve the final concentrations: 10 ppb methanol, 10.3 ppb ethanol, 17 ppb acetone, and 11.8 ppb acetaldehyde. The final pressure was in the range of about 500-600 psi.

TABLE IX

Measurements for Comparative Example 5

| | | Concentration ppb | | | |
|---|---|---|---|---|---|
| Days | Time | MeOH | EtOH | Acetone | Acetaldehyde |
| 0 | Mar. 29, 2004 | 10 | 10.3 | 17 | 11.8 |
| 25 | Apr. 22, 2004 | 9.5 | 20.1 | 20.3 | 0 |
| 38 | May 5, 2004 | 7.3 | 17.7 | 16.4 | 0 |
| 50 | May 17, 2004 | 7.6 | 18.9 | 29.3 | 0 |
| 80 | Jun. 16, 2004 | 7.5 | 20.5 | 14.8 | 0 |
| 141 | Aug. 16, 2004 | 9.7 | 22.1 | 17.6 | 0 |
| 185 | Sep. 29, 2004 | 7 | 13 | 11.5 | |
| 240 | Nov. 23, 2004 | 11 | 22.4 | 25 | 23.5 |
| 291 | Jan. 13, 2005 | 0 | 0 | 22 | 15.5 |
| 323 | Feb. 14, 2005 | 6 | 17 | 14 | 8 |
| 366 | Mar. 29, 2005 | 0 | 0 | 27 | 18.5 |

TABLE X

Stability of MeOH for Comparative Example 5

| Months | Average MeOH Conc (ppb) | % RSD | Variation | % Variation |
|---|---|---|---|---|
| 12.000 | 6.900 | 54.100 | 56.900 | 569.000 |
| 11.000 | 7.600 | 40.900 | 56.900 | 569.000 |
| 10.000 | 7.700 | 41.800 | 56.900 | 569.000 |
| 8.000 | 8.700 | 17.400 | 56.900 | 569.000 |
| 6.000 | 8.400 | 15.500 | 56.900 | 569.000 |
| 5.000 | 8.600 | 14.600 | 21.700 | 217.000 |
| 3.000 | 8.400 | 15.100 | 21.700 | 217.000 |
| 2.000 | 8.600 | 15.700 | 21.700 | 217.000 |

TABLE XI

Stability of EtOH for Comparative Example 5

| Months | Average EtOH Conc (ppb) | % RSD | Variation | % Variation |
|---|---|---|---|---|
| 12.000 | 14.700 | 55.3 | 55.500 | 538.835 |
| 11.000 | 16.200 | 42.400 | 55.500 | 538.835 |
| 10.000 | 16.100 | 45.200 | 55.500 | 538.835 |
| 8.000 | 18.100 | 23.900 | 55.500 | 538.835 |
| 6.000 | 17.500 | 24.600 | 55.500 | 538.835 |
| 5.000 | 18.300 | 22.900 | 19.500 | 189.3204 |
| 3.000 | 17.500 | 23.800 | 19.500 | 189.3204 |
| 2.000 | 16.800 | 26.300 | 19.500 | 189.3204 |

TABLE XII

Stability of Acetone for Comparative Example 5

| Months | Average Acetone Conc (ppb) | % RSD | Variation | % Variation |
|---|---|---|---|---|
| 12.000 | 19.500 | 29.2 | 12.300 | 72.35294 |
| 11.000 | 18.800 | 28.800 | 12.300 | 72.35294 |
| 10.000 | 19.300 | 28.300 | 12.300 | 72.35294 |
| 8.000 | 19.000 | 30.200 | 12.300 | 72.35294 |
| 6.000 | 18.100 | 31.000 | 12.300 | 72.35294 |
| 5.000 | 19.200 | 27.300 | 12.300 | 72.35294 |
| 3.000 | 19.600 | 29.700 | 12.300 | 72.35294 |
| 2.000 | 20.800 | 28.700 | 3.300 | 19.41176 |

TABLE XIII

Stability of Acetaldehyde for Comparative Example 5

| Months | Average Acetaldehyde Conc (ppb) | % RSD | Variation | % Variation |
|---|---|---|---|---|
| 12.000 | 7.730 | 117.341 | 11.800 | 100.000 |
| 11.000 | 6.533 | 133.828 | 11.800 | 100.000 |
| 10.000 | 6.350 | 146.907 | 11.800 | 100.000 |
| 8.000 | 5.043 | 183.446 | 11.800 | 100.000 |
| 6.000 | | | | |
| 5.000 | 1.967 | 244.949 | 11.800 | 100.000 |
| 3.000 | 2.360 | 223.607 | 11.800 | 100.000 |
| 2.000 | 2.950 | 200.000 | 11.800 | 100.000 |

Comparative Example 6

Cylinder 173389

A cylinder, which had been previously passivated with 100 ppb, each of methanol and ethanol (for one month), was subjected to three-five cycles of vacuum (evacuation) and nitrogen purging. It was subsequently evacuated and then passivated overnight with 2 mL of a 50:50 mixture of methanol and ethanol and 100 psi of nitrogen, which corresponds to concentrations of about 2,900 ppm methanol and about 2,000 ppm ethanol. It was again evacuated and then filled with amounts of methanol, ethanol, acetone, and acetaldehyde in ethylene in ethylene as in Comparative Example 5 to achieve the final concentrations: 11.7 ppb methanol and 14.2 ppb ethanol. The final pressure was in the range of about 500-600 psi.

TABLE XIV

Measurements for Comparative Example 6

| Days | Date | MeOH Conc (ppb) | EtOH Conc (ppb) |
|---|---|---|---|
| 0 | Mar. 5, 2004 | 11.7 | 14.2 |
| 50 | Apr. 22, 2004 | 36.1 | 48.9 |
| 63 | May 5, 2004 | 30.6 | 42.7 |
| 75 | May 17, 2004 | 30.9 | 40.7 |
| 105 | Jun. 16, 2004 | 43.2 | 49.8 |
| 166 | Aug. 16, 2004 | 59.4 | 58.8 |
| 210 | Sep. 29, 2004 | 25 | 36 |
| 265 | Nov. 23, 2004 | 25.8 | 55.2 |
| 314 | Jan. 11, 2005 | 38 | 29 |
| 349 | Feb. 15, 2005 | 28 | 27 |
| 391 | Mar. 29, 2005 | 86 | 43 |

TABLE XV

Stability of Methanol for Comparative Example 6

| Months | Average MeOH Conc (ppb) | % RSD | Variation | % Variation |
|---|---|---|---|---|
| 12.000 | 37.700 | 53.092 | 74.300 | 635.043 |
| 11.000 | 32.870 | 38.484 | 47.700 | 407.692 |
| 10.000 | 33.411 | 39.788 | 47.700 | 407.692 |
| 8.000 | 33.843 | 41.640 | 47.700 | 407.692 |
| 6.000 | 33.843 | 44.051 | 47.700 | 407.692 |
| 5.000 | 35.317 | 44.632 | 47.700 | 407.692 |
| 3.000 | 30.500 | 38.315 | 31.500 | 269.231 |
| 2.000 | 27.325 | 39.225 | 24.400 | 208.547 |

TABLE XVI

Stability of Ethanol for Comparative Example 6

| Months | Average EtOH Conc (ppb) | % RSD | Variation | % Variation |
|---|---|---|---|---|
| 12.000 | 40.930 | 32.280 | 44.600 | 314.085 |
| 11.000 | 40.230 | 34.549 | 44.600 | 314.085 |
| 10.000 | 41.700 | 33.317 | 44.600 | 314.085 |
| 8.000 | 43.288 | 32.232 | 44.600 | 314.085 |
| 6.000 | 41.586 | 34.014 | 44.600 | 314.085 |
| 5.000 | 42.517 | 35.888 | 44.600 | 314.085 |
| 3.000 | 39.260 | 37.041 | 35.600 | 250.704 |
| 2.000 | 36.625 | 41.917 | 34.700 | 244.366 |

Example 5

Cylinder 172988

A cylinder which had previously been passivated with 100 ppb, each of methanol and ethanol (for one month), was subjected to three cycles of vacuum (evacuation) and nitrogen purging. It was again evacuated and then passivated with 1% silane at 100 psi overnight. It was again evacuated and passivated with 2 mL of a 50:50 mixture of methanol and ethanol and 100 psi of nitrogen, which corresponds to concentrations of about 2,900 ppm methanol and about 2,000 ppm ethanol. It was evacuated one final time before filling with amounts of methanol, ethanol, acetone, and acetaldehyde in ethylene as in Comparative Example 5 to achieve the final concentrations: 10 ppb methanol, 10.3 ppb ethanol, 17 ppb acetone, and 11.8 ppb acetaldehyde. The final pressure was in the range of about 500-600 psi.

TABLE XVII

Measurements for Example 5

| Days | Date | MeOH | EtOH | Acetone | Acetaldehyde |
|---|---|---|---|---|---|
| 0 | Mar. 29, 2004 | 10 | 10.3 | 17 | 11.8 |
| 25 | Apr. 22, 2004 | 19.5 | 25.5 | 20.5 | |
| 38 | May 5, 2004 | 17.1 | 22.7 | 16.4 | 0 |
| 50 | May 17, 2004 | 18.3 | 23.2 | 28.8 | 0 |
| 80 | Jun. 16, 2004 | 24.1 | 20.8 | 18.2 | 0 |
| 141 | Aug. 16, 2004 | 31.7 | 29.8 | 14.3 | 0 |
| 185 | Sep. 29, 2004 | 24 | 26 | 19 | 0 |
| 240 | Nov. 23, 2004 | 66.9 | 65.8 | 36.5 | |
| 248 | Dec. 1, 2004 | 69 | 48 | 19.5 | 23.5 |
| 288 | Jan. 10, 2005 | 27 | 11 | 15 | 15.5 |

TABLE XVII-continued

Measurements for Example 5

| Days | Date | MeOH | EtOH | Acetone | Acetaldehyde |
|---|---|---|---|---|---|
| 323 | Feb. 14, 2005 | 29 | 29 | 16 | 8 |
| 366 | Mar. 29, 2005 | 32 | 0 | 26 | 18.5 |

TABLE XVIII

Stability of Methanol for Example 5

| Months | Average MeOH Conc (ppb) | % RSD | Variation | % Variation |
|---|---|---|---|---|
| 12.000 | 30.717 | 60.331 | 56.900 | 569.000 |
| 11.000 | 30.600 | 63.502 | 56.900 | 569.000 |
| 10.000 | 30.760 | 66.564 | 56.900 | 569.000 |
| 9.000 | 31.178 | 69.511 | 56.900 | 569.000 |
| 8.000 | 26.450 | 66.229 | 56.900 | 569.000 |
| 6.000 | 20.671 | 84.743 | 21.700 | 217.000 |
| 5.000 | 20.117 | 36.201 | 21.700 | 217.000 |
| 3.000 | 17.800 | 28.668 | 21.700 | 217.000 |
| 2.000 | 16.225 | 26.281 | 9.500 | 95.000 |

TABLE XIX

Stability of Ethanol for Example 5

| Months | Average EtOH Conc (ppb) | % RSD | Variation | % Variation |
|---|---|---|---|---|
| 12.000 | 26.008 | 66.444 | 55.500 | 538.835 |
| 11.000 | 28.373 | 56.249 | 55.500 | 538.835 |
| 10.000 | 28.310 | 59.419 | 55.500 | 538.835 |
| 9.000 | 30.233 | 55.021 | 55.500 | 538.835 |
| 8.000 | 28.013 | 58.169 | 55.500 | 538.835 |
| 6.000 | 22.614 | 27.182 | 19.500 | 189.320 |
| 5.000 | 22.050 | 29.624 | 19.500 | 189.320 |
| 3.000 | 20.500 | 28.989 | 19.500 | 189.320 |
| 2.000 | 20.425 | 33.583 | 19.500 | 189.320 |

TABLE XX

Stability of Acetone for Example 5

| Months | Average Acetone Conc (ppb) | % RSD | Variation | % Variation |
|---|---|---|---|---|
| 12.000 | 20.600 | 32.119 | 19.500 | 114.706 |
| 11.000 | 20.109 | 33.350 | 19.500 | 114.706 |
| 10.000 | 20.520 | 33.731 | 19.500 | 114.706 |
| 9.000 | 21.133 | 33.347 | 19.500 | 114.706 |
| 8.000 | 21.338 | 35.175 | 19.500 | 114.706 |
| 6.000 | 19.171 | 36.760 | 11.800 | 69.412 |
| 5.000 | 19.200 | 26.714 | 11.800 | 69.412 |
| 3.000 | 20.600 | 24.601 | 11.800 | 69.412 |
| 2.000 | 20.675 | 27.620 | 11.800 | 69.412 |

TABLE XXI

Stability of Acetaldehyde for Example 6

| Months | Average Acetaldehyde Conc (ppb) | % RSD | Variation | % Variation |
|---|---|---|---|---|
| 12.000 | 7.730 | 117.341 | 11.800 | 100.000 |
| 11.000 | 6.533 | 133.828 | 11.800 | 100.000 |

TABLE XXI-continued

Stability of Acetaldehyde for Example 6

| Months | Average Acetaldehyde Conc (ppb) | % RSD | Variation | % Variation |
|---|---|---|---|---|
| 10.000 | 6.350 | 146.907 | 11.800 | 100.000 |
| 9.000 | 5.043 | 183.446 | 11.800 | 100.000 |
| 8.000 | | | | |
| 6.000 | 1.967 | 244.949 | 11.800 | 100.000 |
| 5.000 | 2.360 | 223.607 | 11.800 | 100.000 |
| 3.000 | 3.933 | 150.000 | 11.800 | 100.000 |
| 2.000 | 2.950 | 230.940 | 11.800 | 100.000 |

Although the description herein is intended to be representative of the invention, it is not intended to limit the scope of the appended claims.

What is claimed is:

1. A method of making a reactive gas product comprising the steps of:
    a) exposing an internal metal surface of a container to a first fluid composition, comprising a silicon-containing compound for a time sufficient to allow at least some of the silicon-containing compound to react with an oxygen-containing compound present to form a silicon-treated surface on at least some of the internal metal surface, the silicon-containing compound selected from the group consisting of compounds within the general formula:

$SiR^1R^2R^3R^4$ wherein $R^1$, $R^2$, $R^3$, and $R^4$ are the same or different and are independently selected from the group consisting of hydrogen, halogen, alkyl, aryl, amine, halogenated alkyl, and halogenated aryl;
    b) evacuating the container for a time sufficient to remove substantially all silicon-containing compound that has not reacted with the oxygen-containing compound to form the silicon-treated surface;
    c) exposing the silicon-treated surface to a second fluid composition, the second fluid composition comprising a reactive gas having a concentration that is at least 10 times greater than the intended reactive gas concentration of the reactive gas product;
    d) evacuating the container for a time sufficient to remove substantially all of the second fluid composition, thus forming a passivated internal metal surface in the container including the silicon treated surface and reactive gas adsorbed on the silicon treated surface; and
    e) filling the container with a third fluid composition having the intended reactive gas concentration for the reactive gas product.

2. The method of claim 1, wherein the silicon-containing compound is selected from the group consisting of silane and a methyl-containing silane.

3. The method of claim 2, wherein said methyl-containing silane is selected from the group consisting of methylsilane, dimethylsilane, trimethylsilane, and tetramethylsilane.

4. The method of claim 1, wherein steps i) and ii) are repeated prior to step iii).

5. The method of claim 1, wherein the composition of the silicon-containing gas used in step iii) ranges from about 100 ppm to 100%.

6. The method of claim 1, wherein during step i) the first fluid composition is heated to a temperature of not more than 74° C.

7. The method of claim 1, wherein during step iii) the second fluid composition is heated to a temperature of not more than 74° C.

8. The method of claim 1, wherein said reactive gas is selected from the group consisting of:
    a) nitrous oxide;
    b) nitric oxide;
    c) hydrogen chloride;
    d) chlorine;
    e) boron trichloride;
    f) ammonia;
    g) amines;
    h) amides;
    i) alcohols;
    j) ethers;
    k) carbonyl compounds; and
    l) gases that will not react with a silicon-containing material.

9. The method of claim 1, wherein said reactive gas is selected from the group consisting of carbondisulfide, carbonylsulfide, and compounds within formula (I):

$$Y\text{—}S\text{—}X \tag{I}$$

wherein S is sulfur, and

X and Y are the same or different and are independently selected from the group consisting of hydrogen, alkyl, aryl, oxygen, hydroxyl, amino and aminosilane.

10. The method of claim 1, wherein said reactive gas includes a nitrogen-containing compound having the formula (II) comprising:

$$\begin{array}{c} Z \\ | \\ X\text{—}N\text{—}Y \end{array} \tag{II}$$

wherein N is nitrogen, and

X, Y and Z are the same or different and are independently selected from the group consisting of hydrogen, alkyl, aryl, hydroxyl and carbonyl.

* * * * *